United States Patent [19]
Fuji

[11] Patent Number: 5,768,203
[45] Date of Patent: Jun. 16, 1998

[54] SINGLE-CHIP MEMORY SYSTEM HAVING A PAGE ACCESS MODE

[75] Inventor: Yukio Fuji, Kanagawa, Japan

[73] Assignee: NEC Corporation, Tokyo, Japan

[21] Appl. No.: 839,130

[22] Filed: Apr. 23, 1997

[30] Foreign Application Priority Data

Apr. 25, 1996 [JP] Japan .................................. 8-105244

[51] Int. Cl.$^6$ ..................................................... G11C 7/00
[52] U.S. Cl. ........................ 365/208; 365/238.5; 365/207
[58] Field of Search ............................... 365/238.5, 207, 365/208; 327/51, 52, 53

[56] References Cited

U.S. PATENT DOCUMENTS

| | | | |
|---|---|---|---|
| 5,289,419 | 2/1994 | Hashizumi | 365/207 |
| 5,508,643 | 4/1996 | Khieu | 327/51 |
| 5,559,455 | 9/1996 | McPartland | 327/53 |

FOREIGN PATENT DOCUMENTS

| | | |
|---|---|---|
| 61-294692 | 12/1986 | Japan . |
| 4-263195 | 9/1992 | Japan . |

Primary Examiner—David C. Nelms
Assistant Examiner—Son Mai
Attorney, Agent, or Firm—Whitham, Curtis & Whitham

[57] ABSTRACT

To avoid large consumption of current, a memory system includes a first memory cell array and a second memory cell array, each including a plurality of word lines connected to a plurality of memory cells of the first and second memory cell arrays, respectively, a first activator for activating a first word line of the word lines of the first memory cell array, and for making the first memory cell array output data from the memory cells connected to the first word line, a second activator for activating a second word line of the word lines of the second memory cell array, and for making the second memory cell array output data from the memory cells connected to the second word line, a first sense circuit for receiving the data from the first memory cell array, and for amplifying the data from the first memory cell array, a second sense cirsuit for receiving the data from the second memory cell array, and for amplifying the data from the second memory cell array at a rate faster than the first sense ciruit, and an output control circuit for outputting the data of the second sense circuit, and for outputting subsequently the data of the first sense circuit.

20 Claims, 11 Drawing Sheets

SINGLE-CHIP MEMORY SYSTEM HAVING A PAGE ACCESS MODE

BACKGROUND OF THE INVENTION

The present invention generally relates to a memory system having a "page access mode", and more particularly to a memory system including a plurality of read-only memory (ROM) cell arrays.

DESCRIPTION OF THE RELATED ART

To access data faster, some memory systems have a page access mode. When a memory system uses the page access mode, the memory system can output data sequentially from memory cells connected to the same word line without a new address input (e.g., if eight memory cells MC1–MC8 are connected to one word line, then data from the cell MC1 can be output, followed sequentially by data in the cells MC2, MC3, . . . etc.).

This function is useful to access data faster, especially complicated data such as drawings, pictures, Japanese "Kanji" characters, etc.

Figure 1:
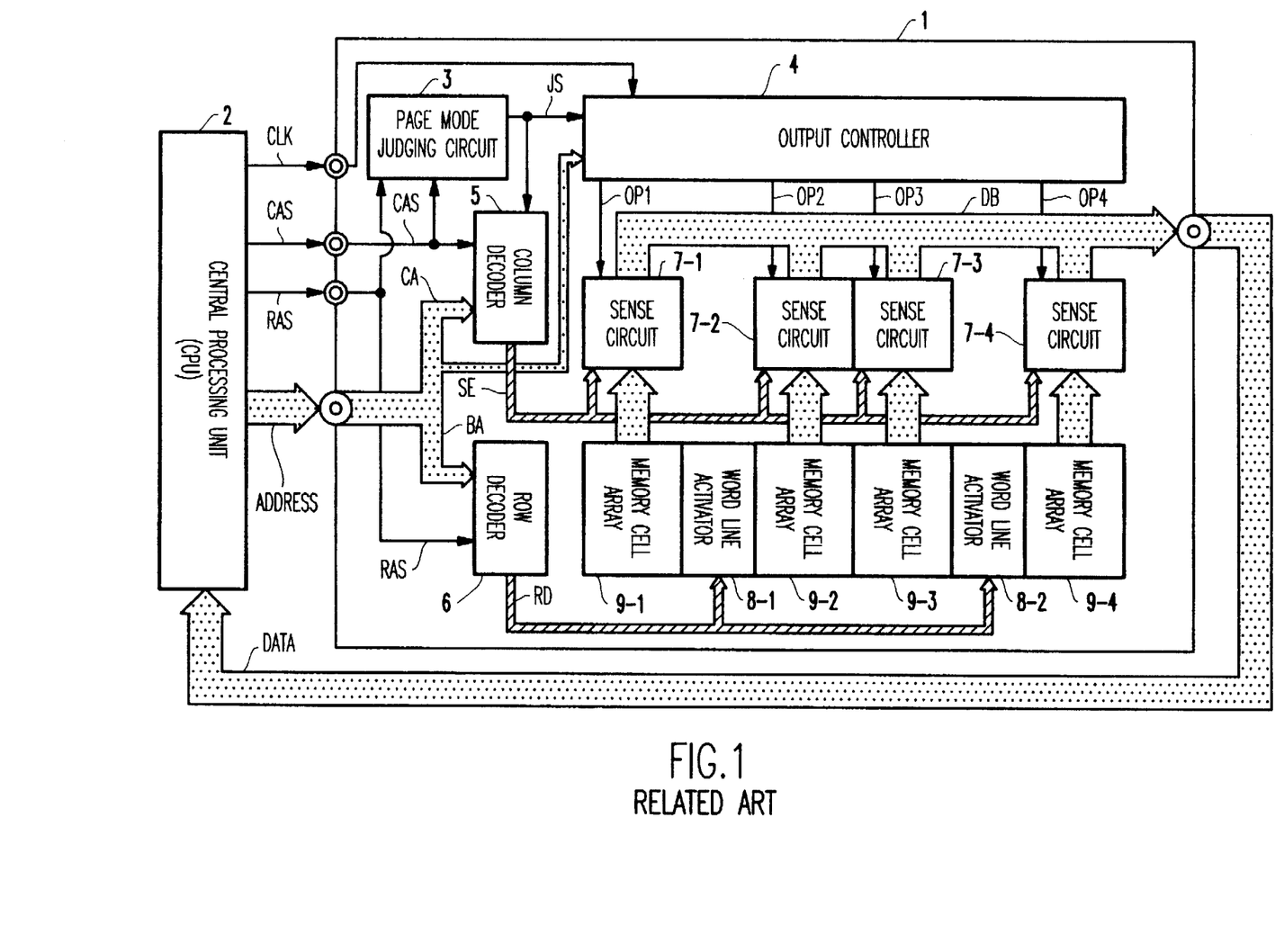
FIG. 1 illustrates a conventional memory system.

FIG. 1 shows a conventional (e.g., related art but not prior art) memory system including a single-chip memory device 1 and an external central processing unit (CPU) 2. The memory device includes an array of read-only memory (ROM) cells 9-1–9-4 (e.g., a mask ROM (MROM), an erasable and programmable ROM (EPROM), and/or an electrically erasable and programmable ROM (EEPROM)). The arrays 9-1–9-4 have a plurality of word lines, a plurality of bit lines and a plurality of ROM cells. The CPU 2 processes instructions by using data from the memory device 1.

The memory device 1 also includes input terminals (unreferenced) for receiving a row address strobe (RAS) signal, a column address strobe (CAS) signal, a clock (CLK) signal, and an address signal having a row address portion (RA) and a column address portion (CA), respectively.

A row decoder 6 decodes a row address portion RA, and outputs a decoded signal RD. The row decoder is activated when the CPU changes the RAS signal to an active high level (e.g., "1") from an inactive low level (e.g., "0").

Word line activators 8-1 and 8-2 receive the decoded signal RD, and activate one word line of the word lines in response to the decoded signal RD. In FIG. 1, memory cells 9-1 and 9-2 are connected together. Therefore, the word line activator 8-1 activates one word line of memory cell array 9-1 and one word line of memory cell array 9-2 simultaneously, in response to the decoded signal RD. Additionally, memory cells 9-3 and 9-4 are connected together. Therefore, the word line activator 8-2 activates one word line of memory cell array 9-3 and one word line of memory cell array 9-4 simultaneously, in response to the decoded signal RD. The memory cell arrays 9-1–9-4 output all data from ROM cells connected to a corresponding word line to sense circuits 7-1–7-4.

Assuming one word line activator could activate four memory cell arrays simultaneously, the activator could be designed to be larger and more powerful. However, an access speed for reading data would be slow relative to the structure shown in FIG. 1, because the length of one word line would become longer when four memory cell arrays are connected together. It is well known that a parasitic capacitance and a resistance of a word line become larger as the word line becomes longer. Therefore, a word line usually is designed to be as short as possible for achieving a high access speed.

Figure 2:
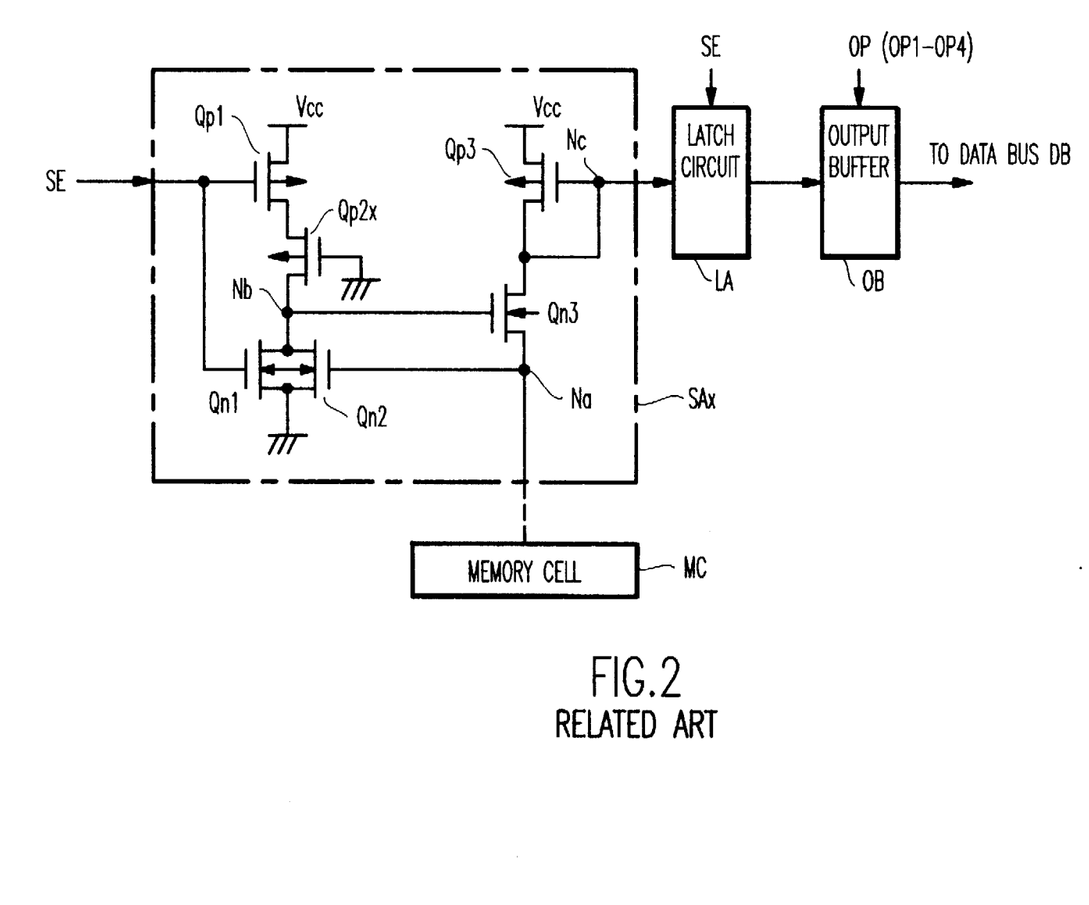
FIG. 2 is a circuit diagram showing a part of sense circuits 7-1–7-4 in the memory system of FIG. 1.

Sense circuits 7-1–7-4 each have the same construction. Each sense circuit has a number of sense amplifiers SAx, latch circuits LA, and output buffers OB, as shown in FIG. 2, corresponding to the number of ROM cells connected to the word line selected (e.g., activated) by the corresponding word line activator. The sense circuits 7-1–7-4 amplify data from a corresponding memory cell array, and output the amplified data to a data bus DB in response to output signal OP (e.g., OP1–OP4) from an output controller 4.

A page mode judging circuit 3 receives the CAS and RAS signals. When both CAS and RAS signals have a predetermined timing, which represents a page access mode, the page mode judging circuit 3 changes a judging signal JS from an inactive level (e.g., "0") to an active level (e.g., "1").

A column decoder 5 decodes the column address portion CA, and outputs a plurality of decoded signals SE for activating a corresponding sense amplifier SAx, as shown in FIG. 2, of sense circuits 7-1–7-4. The column decoder is activated when the CPU 2 changes the CAS signal to an active high level (e.g., "1") from an inactive low level (e.g., "0").

When the column decoder 5 receives the judging signal JS having an inactive level, the column decoder 5 changes one signal SE of the plurality of signals SE corresponding to the column address portion CA, to an active level (e.g., "0") from an inactive level (e.g., "1"). Therefore, sense circuits 7-1–7-4 each can output corresponding data of a plurality of data from corresponding memory cell arrays 9-1–9-4.

When the column decoder 5 receives the judging signal JS having an active level, the column decoder 5 changes all signals SE of the plurality of signals SE regardless of the column address portion CA, to an active level (e.g., "0") from an inactive level (e.g., "1"). Therefore, sense circuits 7-1–7-4 each can output all data of a plurality of data from corresponding memory cell arrays 9-1–9-4.

An output controller 4 receives the column address portion CA and the judging signal JS. When the judging signal JS has an inactive level, the output controller 4 changes one signal of signals OP1–OP4 corresponding to the column address portion CA to an active level (e.g., "1") from an inactive level (e.g., "0"). Therefore, one sense circuit of the sense circuits 7-1–7-4 can output data.

When the judging signal JS has an active level, the output controller 4 changes signals OP1–OP4 regardless of the column address portion CA, to an active level (e.g., "1") from an inactive level (e.g., "0") sequentially in response to the clock signal CLK. Therefore, for example, first, the sense circuit 7-1 outputs data, then, the sense circuit 7-2 outputs data, thirdly, the sense circuit 7-3 outputs data and finally the sense circuit 7-4 outputs data. Specifically, the above operation occurs because a bit size of the data bus DB is a same size for each sense circuit 7-1–7-4.

FIG. 2 illustrates the sense amplifier SAx, the latch circuit LA, and the output buffer OB in detail. The sense amplifier SAx is activated and amplifies data from a corresponding memory cell MC, when the signal SE has an active level (e.g., "0"). The latch circuit LA latches (e.g., stores) data from the sense amplifier SAx when the signal SE is changed to an inactive level (e.g., "1") from an active level (e.g., "1"), and outputs the latched data to the output buffer OB. The output buffer OB outputs data from the latch circuit LA to the data bus DB when the output signal OP has an active level (e.g., "1").

The sense amplifier SAx includes an N-type metal oxide semiconductor (MOS) transistor Qn1 having a gate receiving the signal SE and a source-drain path between a node Nb and a reference voltage (e.g., ground), a P-type MOS transistor Qp1 having a gate receiving the signal SE and a source connected to a reference voltage (e.g., Vcc), a P-type MOS transistor Qp2x having a gate connected to a reference voltage (e.g., ground) and a source-drain path between the node Nb and a drain of the P-type MOS transistor Qp1, an N-type MOS transistor Qn2 having a gate connected to a node Na and a source-drain path between the node Nb and a reference voltage (e.g., ground), an N-type MOS transistor Qn3 having a gate connected to the node Nb and a source-drain path between the node Na and a node Nc, and a P-type MOS transistor Qp3 having a gate connected to the node Nc and a source-drain path between the node Nc and a reference voltage (e.g., Vcc).

Data of the node Nc is outputted to the latch circuit LA. The node Na is connected to a corresponding bit line for receiving data from a corresponding memory cell MC, which is a ROM.

Figure 3:
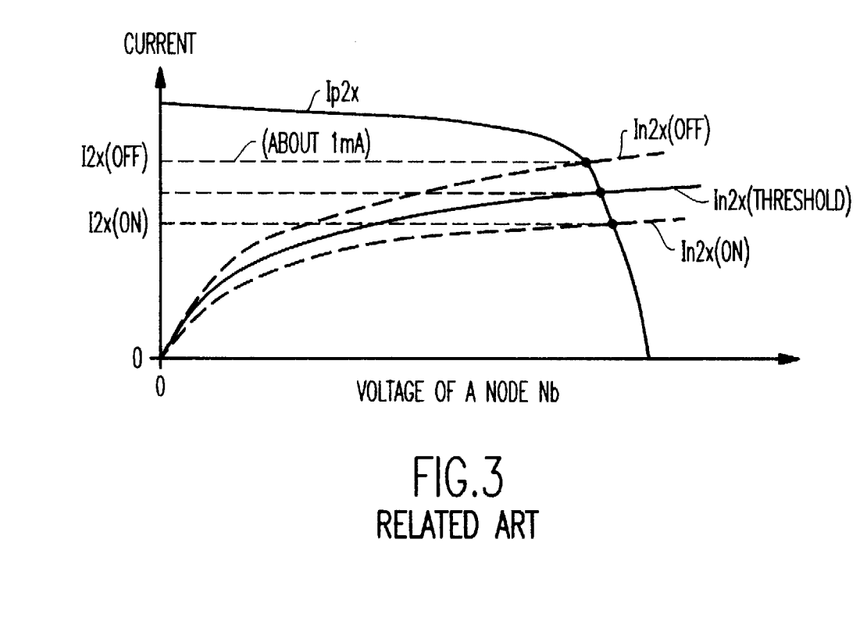
FIG. 3 is a diagram showing a current in a sense amplifier SAx of the sense circuits of FIG. 2.

FIG. 3 illustrates a current In2x passing through the source-drain path of the N-type MOS transistor Qn2 and illustrates a problem of the conventional system. In FIG. 3, In2x(OFF) represents a current when the memory cell MC has first data (e.g., "0"), and In2x(ON) represents a current when the memory cell MC has second data (e.g., "1"). When the signal SE has an active level (e.g., "0"), In2x always has some value (current) regardless of the data contained in the memory cell MC. The value is calculated easily to find a cross-point between a curve representing a current Ip2x passing through the P-type MOS transistor Qp2x and a curve representing the current In2x(ON) or In2x(OFF).

According to FIG. 3, a current I2x(OFF) consumed by the sense amplifier SAx is about 1 mA, when the memory cell MC has the first data (e.g., "0"). Of course, a current I2x(ON) consumed by the sense amplifier SAx, when the memory cell MC has the second data (e.g., "1"), is lower than the current I2x(OFF).

Figure 4:
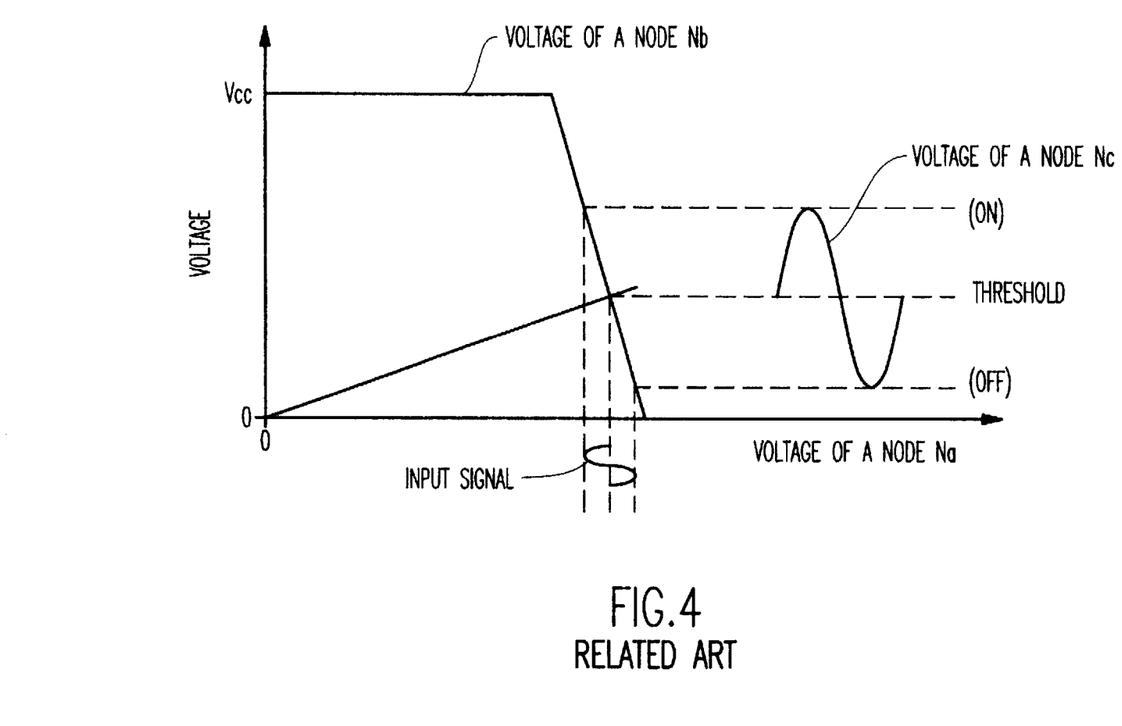
FIG. 4 is a diagram showing an amplification operation by the sense amplifier SAx of FIG. 2.

FIG. 4 illustrates a relationship between an input signal from the memory cell MC and an output signal from the sense amplifier SAx. In FIG. 4, (OFF) represents a voltage when the memory cell MC has the first data (e.g., "0"), and (ON) represents a voltage when the memory cell MC has the second data (e.g., "1"). MOS transistors in the sense amplifier SAx are designed according to the diagram shown in FIG. 4. According to the diagram, the sense amplifier SAx outputs a large voltage signal from the node Nc even if a signal from the memory cell MC is small. Therefore, the sense amplifier SAx can amplify data faster (e.g., a so-called "fast sense amplifier").

However, such a fast sense amplifier amplifies noise, because the fast sense amplifier amplifies a small signal and outputs a much larger (amplified) signal. Therefore, a faulty operation is performed by the CPU 2.

Moreover, in the related art, a plurality of word line activators 8-1 and 8-2 are formed, as shown in FIG. 1, for increasing access speed. However, making a highly-integrated device is difficult since a plurality of word line activators are required.

Further, a total current value consumed by the device 1 becomes large when using the page access mode. For example, when a data size of the data bus DB is 16 bits, the maximum value of the total current value becomes 16 mA×4 (e.g., the number of sense circuits 7-1-7-4)=64 mA with the structure of FIG. 1. However, recently, a memory system must access 256 words (e.g., where 1 word is 16 bits) sequentially by using the page access mode. Therefore, if such a memory system is fabricated by using the concept of the related art system, the memory system would consume 16 mA×256=4096 mA. Thus, serious problems would result including wires being broken due to an electro-migration of the wires (e.g., wires for the power-supply). Therefore, the system would have a short service life.

SUMMARY OF THE INVENTION

In view of the foregoing problems of the conventional memory system, it is therefore an object of the present invention to provide an improved memory system having a page access mode.

It is another object of the present invention to provide an improved sense amplifier for amplifying a data from a corresponding memory cell.

In a first aspect, a memory system according to the present invention includes a first memory cell array and a second memory cell array, each including a plurality of word lines connected to a plurality of memory cells of the first and second memory cell arrays, respectively, a first activator for activating a first word line of the word lines of the first memory cell array, and for making the first memory cell array output data from the memory cells connected to the first word line, a second activator for activating a second word line of the word lines of the second memory cell array, and for making the second memory cell array output data from the memory cells connected to the second word line, a first sense circuit for receiving the data from the first memory cell array, and for amplifying the data from the first memory cell array, a second sense circuit for receiving the data from the second memory cell array, and for amplifying the data from the second memory cell array at a rate faster than that of the first sense circuit, and an output control circuit for outputting the data of the second sense circuit, and for outputting subsequently the data of the first sense circuit.

With the unique and unobvious structure of the present invention, the memory system can output the data of the second sense circuit for amplifying the data from the second memory cell array faster than that of the first sense circuit, and can output subsequently the data of the first sense circuit. Therefore, using the same sense circuits is unnecessary for amplifying data faster.

BRIEF DESCRIPTION OF THE DRAWINGS

The foregoing and other objects, aspects, and advantages will be better understood from the following detailed description of preferred embodiments of the invention with reference to the drawings, in which.

DETAILED DESCRIPTION OF PREFERRED EMBODIMENTS OF THE INVENTION

Figure 5:
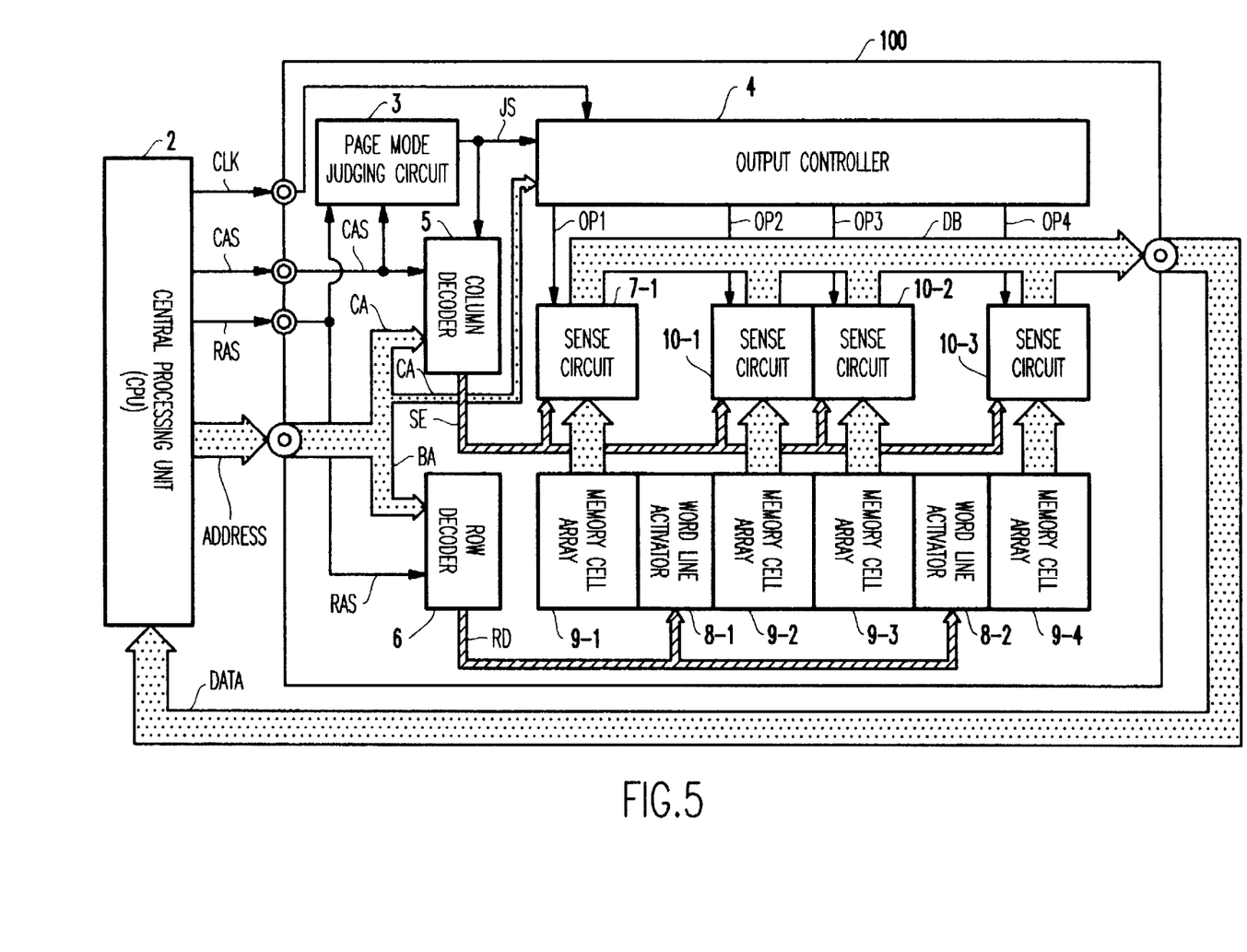
FIG. 5 illustrates a memory system 100 of a first embodiment according to the present invention.

Referring now to the drawings, and more particularly to FIG. 5, a single-chip semiconductor memory device 100 according to a first embodiment of the present invention has sense circuits 10-1–10-3 instead of the sense circuits 7-2–7-4 as shown in FIG. 1. The same parts in FIG. 5 as those in FIG. 1 are numbered with the same reference numerals as in FIG. 1, and, for brevity, explanations of these parts are omitted from the following description.

Figure 6:
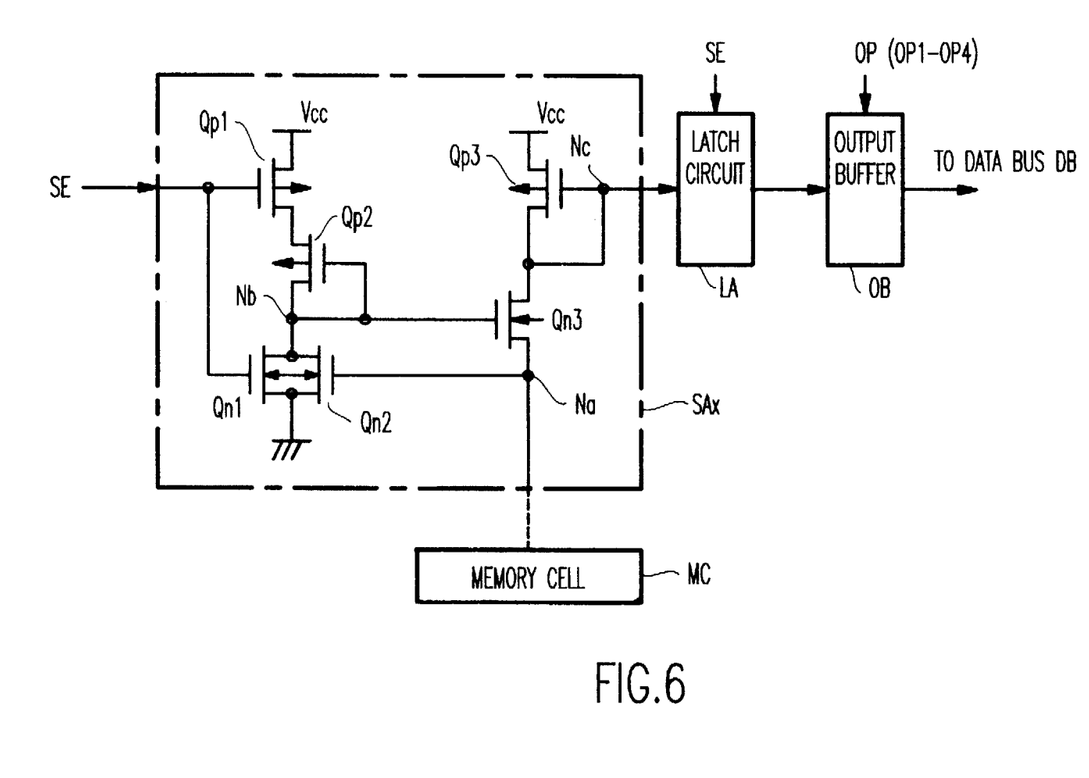
FIG. 6 is a circuit diagram showing a part of sense circuits 10-1–10-3 in the memory system 100 of the first embodiment according to the present invention.

Sense circuits 10-1–10-3 each have the same construction. Each sense circuit has a number of sense amplifiers SA, latch circuits LA, and output buffers OB, as shown in FIG. 6, corresponding to the number of ROM cells connected to the word line selected (e.g., activated) by the corresponding word line activator. The sense circuits 10-1–10-3 amplify data from a corresponding memory cell array, and output the amplified data to a data bus DB in response to output signal OP (e.g., OP1–OP4) from an output controller 4.

FIG. 6 illustrates the sense amplifier SA, the latch circuit LA, and the output buffer OB in detail. The operations of the latch circuit LA and the output buffer OB are omitted because they have already been explained above. The sense amplifier SA is activated and amplifies data from a corresponding memory cell MC, when the signal SE has an active level (e.g., "0").

The sense amplifier SA includes an N-type metal oxide semiconductor (MOS) transistor Qn1 having a gate receiving the signal SE and a source-drain path between a node Nb and a reference voltage (e.g., ground), a P-type MOS transistor Qp1 having a gate receiving the signal SE and a source connected to a reference voltage (e.g., Vcc), a P-type MOS transistor Qp2 having a gate connected to the node Nb and a source-drain path between the node Nb and a drain of the P-type MOS transistor Qp1, an N-type MOS transistor Qn2 having a gate connected to a node Na and a source-drain path between the node Nb and a reference voltage (e.g., ground), an N-type MOS transistor Qn3 having a gate connected to the node Nb and a source-drain path between the node Na and a node Nc, and a P-type MOS transistor Qp3 having a gate connected to the node Nc and a source-drain path between the node Nc and a reference voltage (e.g., Vcc).

Data of the node Nc is outputted to the latch circuit LA. The node Na is connected to a corresponding bit line for receiving data from a corresponding memory cell MC, which may be a ROM.

Figure 7:
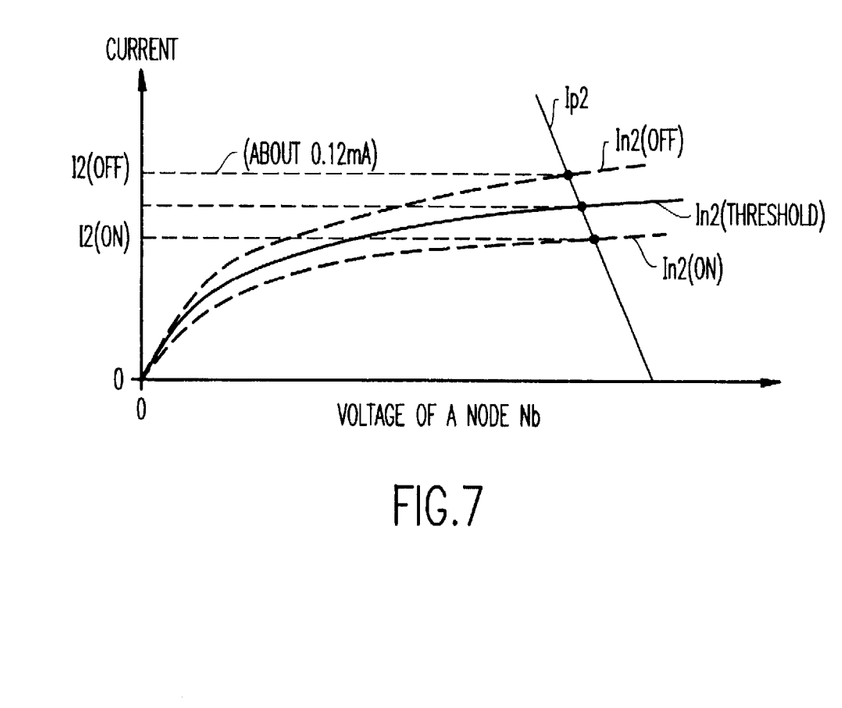
FIG. 7 is a diagram showing a current in a sense amplifier SA of the sense circuits of FIG. 6.

FIG. 7 is a diagram for illustrating a current In2 passing through the source-drain path of the N-type MOS transistor Qn2. In FIG. 7, In2(OFF) represents a current when the memory cell MC has first data (e.g., "0"), and In2(ON) represents a current when the memory cell MC has second data (e.g., "1"). When the signal SE has an active level (e.g., "0"), In2 always has some value (e.g., it is not 0 voltage) regardless of data contained in the memory cell MC. The value is calculated easily to find a cross-point between a curve representing a current Ip2 passing through the P-type MOS transistor Qp2 and a curve representing the current In2(ON) or In2(OFF). In this case, the P-type MOS transistor Qp2 works as a resistor, because the gate and the drain are connected together by node Nb. Therefore, the current Ip2 decreases gradually, as shown in FIG. 7.

According to FIG. 7, a current I2(OFF) consumed by the sense amplifier SA is about 0.12 mA, when the memory cell MC has the first data (e.g., "0"). Of course, a current I2(ON) consumed by the sense amplifier SAx, when the memory cell MC has the second data (e.g., "1"), is lower than the current I2(OFF).

Figure 8:
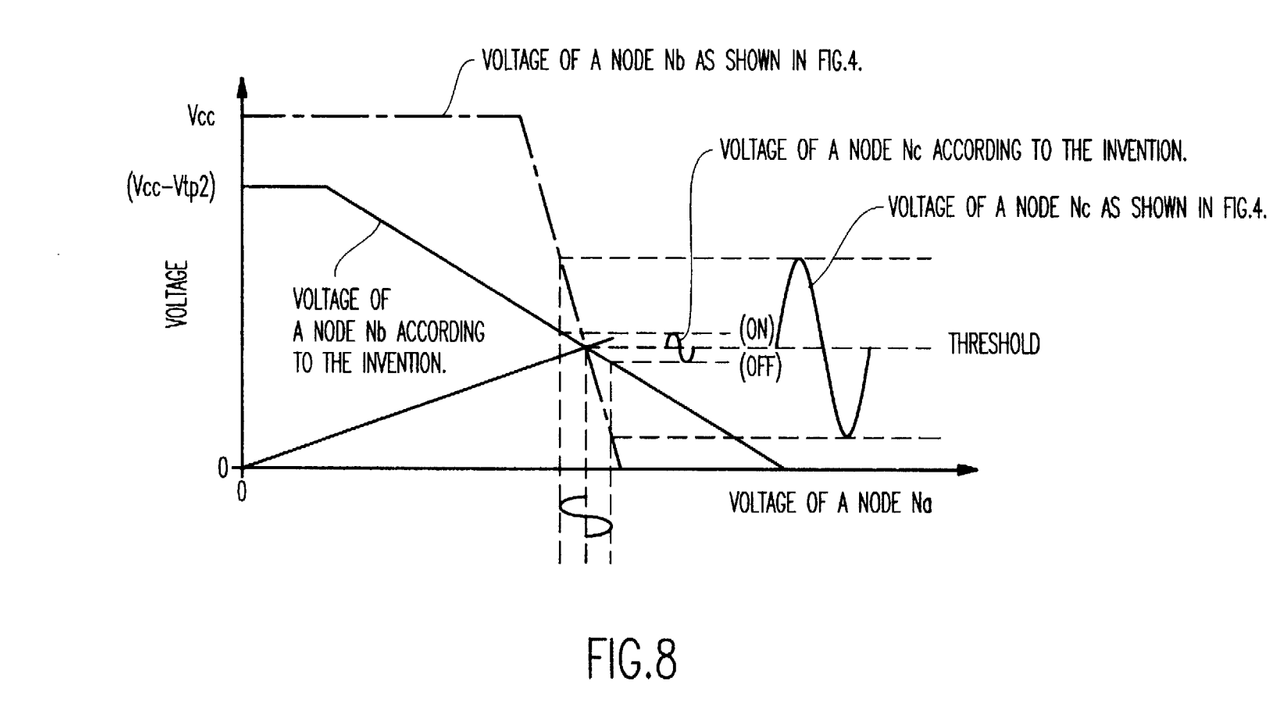
FIG. 8 is a diagram showing an amplification operation in the sense amplifier SA of FIG. 6.

FIG. 8 illustrates a relationship between an input signal from the memory cell MC and an output signal from the sense amplifier SA. In FIG. 8, (OFF) represents a voltage when the memory cell MC has the first data (e.g., "0"), and (ON) represents a voltage when the memory cell MC has the second data (e.g., "1"). Vtp2 represents a threshold voltage of the P-type MOS transistor Qp2. In this case, a voltage curve of the node Nb starts from (Vcc-Vtp2), because the gate and the drain of the P-type MOS transistor Qp2 are connected together by the node Nb. Further, the voltage curve of the node Nb goes to 0 voltage more gradually than the voltage curve of the node Nb, as shown in FIG. 4.

In the first embodiment of the present invention, MOS transistors in the sense amplifier SA are preferably designed according to the waveforms shown in FIG. 8. According to FIG. 8, the sense amplifier SA outputs a smaller voltage signal from the node Nc than the voltage signal shown in FIG. 4, if a signal from the memory cell MC is small. Therefore, CPU 2 does not operate erroneously, because noise is not amplified very much.

Of course, the speed of the sense amplifier SA (e.g., a so-called "slow sense amplifier") for amplifying data becomes slower than the speed of the sense amplifier SAx (e.g., the first sense amplifier) shown in FIG. 2, because the sense amplifier SA has a low ratio (gain) for amplifying data. Actually, the time for judging a level of data from a memory cell MC becomes 120% of the time in the related art system, even if the sense amplifier SA, the latch circuit LA and the other apparatus of the device 100 are designed optimally.

However, in the first embodiment of the present invention, an access speed for reading data is the same as the related art system shown in FIG. 1, when the device 100 uses the page access mode.

As mentioned above, the sense circuit 7-1 in the related art system includes a plurality of fast sense amplifiers, whereas the inventive sense circuits 10-1–10-3 include a plurality of slow sense amplifiers. During the page access mode, sense amplifiers in the sense circuits 7-1 and 10-1–10-3 are simultaneously activated by the column decoder 5. Of course, levels of data in the sense circuits 10-1–10-3 are not fixed when levels of data in the sense circuit 7-1 are fixed.

However, the output controller 4 first activates the signal OP1 for making the sense circuit 7-1 output data, and thereafter activates the signals OP2–OP4 sequentially in response to the clock signal CLK for making the sense circuits 10-1–10-3 output data sequentially. Sense circuits 10-1–10-3 are designed for fixing (e.g., completing judging) levels of their data, before the sense circuit 7-1 outputs its data. Therefore, the device 100 can output data at the same speed as in the related art system.

Further, the total current consumed by the device 100 is lower than the current consumed by the device 1 shown in FIG. 1. This is a significant advantage over the related art system.

Figure 9:
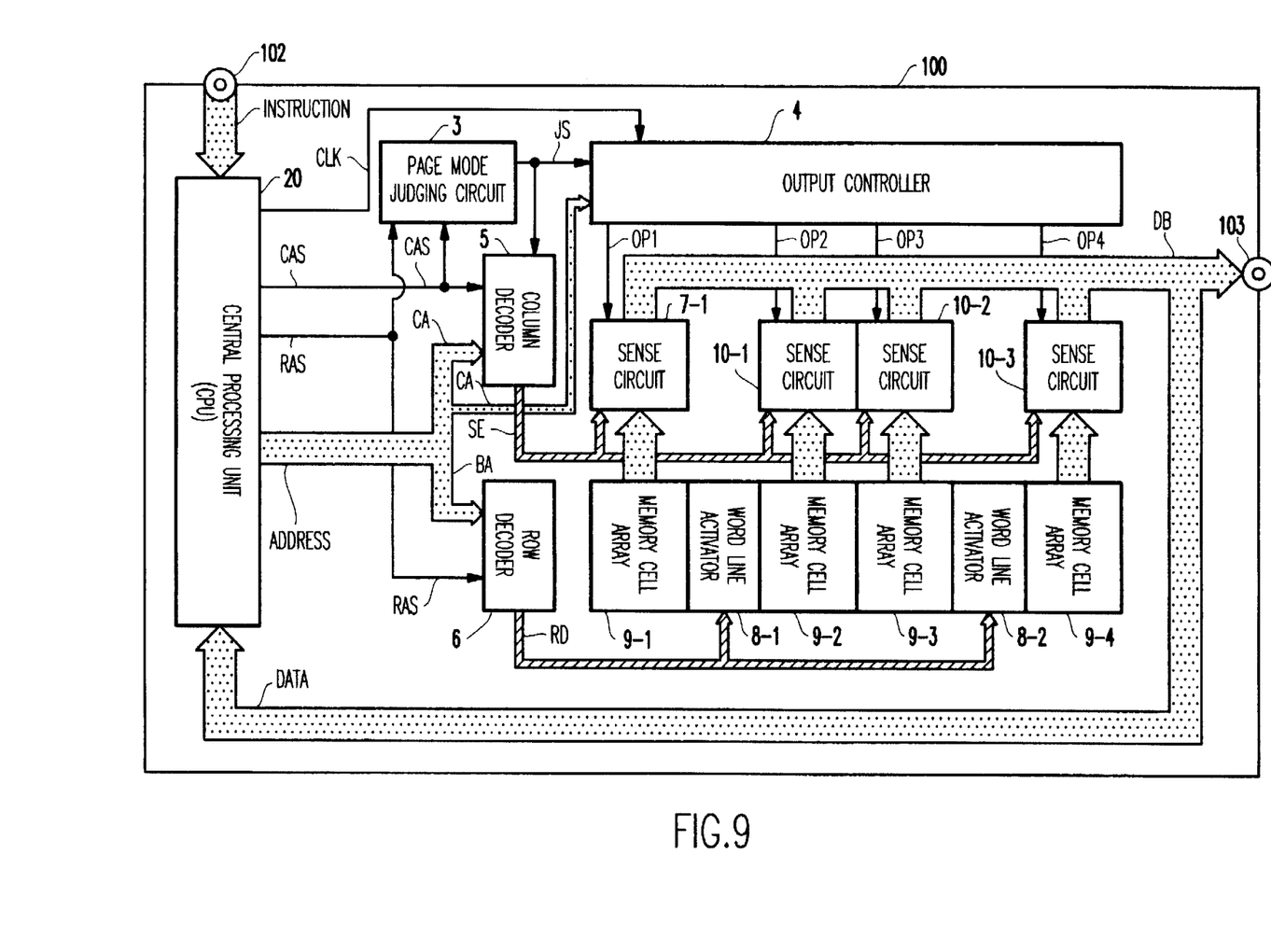
FIG. 9 is a diagram showing a memory system 101 of a second embodiment according to the present invention.

FIG. 9 illustrates a single-chip semiconductor memory system 101 according to a second embodiment of the present invention. The same parts in FIG. 9 as those in FIG. 5 are numbered with the same reference numerals, and, for brevity, explanations of these parts are omitted from the following description.

The system 101 includes an internal CPU 20 which receives instructions from an input terminal 102, and processes the instructions by using data from the memory cell arrays 9-1–9-4. The system 101 outputs data from the memory cell arrays 9-1–9-4 to the external apparatus by using an output terminal 103. This embodiment has the same advantages as the system shown in FIG. 5 and described above. Further, this embodiment outputs data faster than the system shown in FIG. 5, because there are no input terminals required for the address, RAS, CAS and CLK signals.

Figure 10:
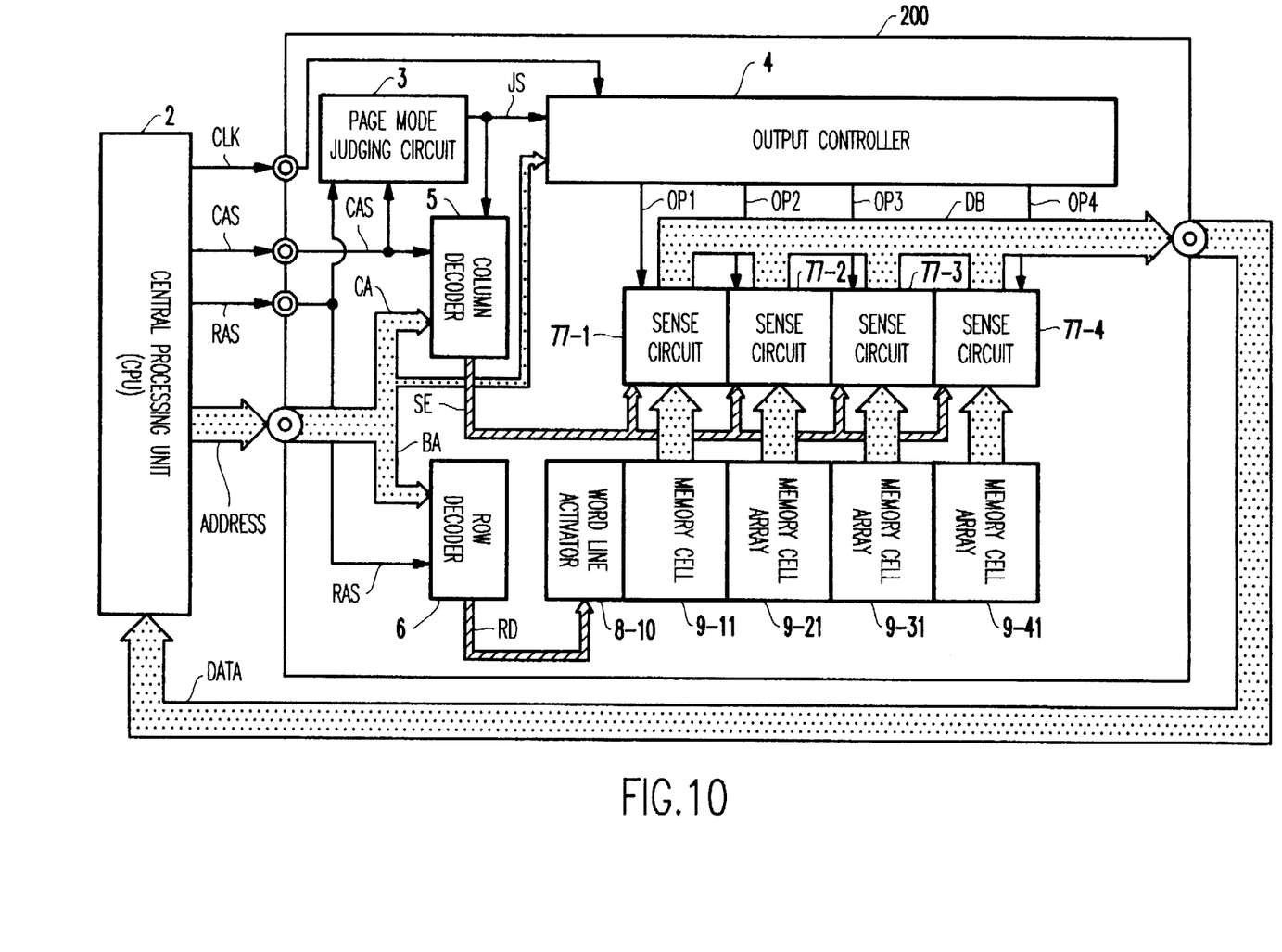
FIG. 10 is a diagram showing a memory system 200 of a third embodiment according to the present invention.

FIG. 10 illustrates a single-chip semiconductor memory device 200 according to a third embodiment of the present invention. The same parts in FIG. 10 as those in FIG. 5 are numbered with the same reference numerals, and, for brevity, explanations of these parts are omitted from the following description.

In the third embodiment of the present invention, a single word line activator 8-10 is formed instead of a plurality of word line activators 8-1 and 8-2, as shown in FIG. 1. Therefore, all memory cell arrays 9-11–9-41 are connected together, and the word line activator 8-10 activates memory cell arrays 9-11–9-41 simultaneously. This is advantageous in terms of system speed.

Of course, when the word line activator 8-10 activates one word line among a plurality of word lines, memory cells in the memory cell array 9-11 can output data faster than memory cells in the memory cell array 9-41, because a time delay occurs by the parasitic capacitance and the resistance of the word line. However, the output controller 4 is designed to activate signals sequentially from the signal OP1 to the signal OP4.

Hence, the device 200 outputs data sequentially in the order from the data of the memory cell array 9-11 formed closest to the word line activator 8-10, to data of the memory cell array 9-41 formed farthest from the word line activator 8-10. Therefore, the device 200 can output data at the same speed as in the related art system.

Further, according to the third embodiment, a device having higher integration can be formed over that of the related art system, because the device 200 has only one word line activator 8-10.

In the third embodiment, all sense circuits 77-1–77-4 may include fast sense amplifiers and/or slow sense amplifiers, or a combination thereof. More preferably, the sense circuit 77-1 includes fast sense amplifiers and sense circuits 77-2–77-4 include slow sense amplifiers because sense circuits 77-2–77-4 are designed for fixing (e.g., completing judging) levels of their data, before the sense circuit 77-1 outputs its data. Therefore, the device 200 can output data at the same speed as in the related art system. Further, the total current consumed by the device 200 is lower than the current consumed by the device 1 shown in FIG. 1.

Figure 11:
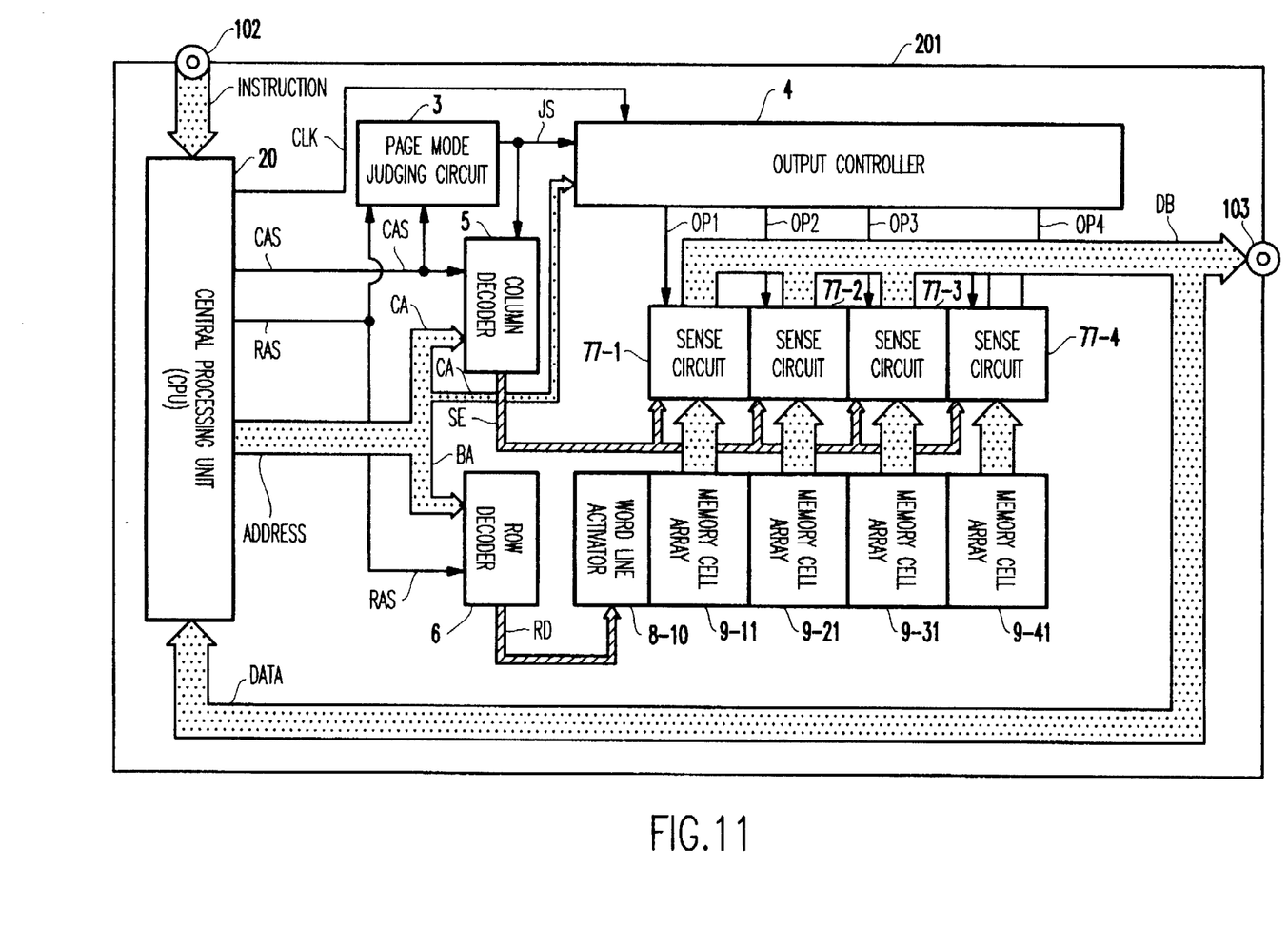
FIG. 11 is a diagram showing a memory system 201 of a fourth embodiment according to the present invention.

FIG. 11 illustrates a single-chip semiconductor memory system 201 according to a fourth embodiment of the present invention. The same parts in FIG. 11 as those in FIGS. 5, 9 and 10 are numbered with the same reference numerals, and, for brevity, explanations of these parts are omitted.

The fourth embodiment has a same advantage as the third embodiment. Further, this embodiment outputs data faster than the system shown in FIG. 10, because input terminals for the address, RAS, CAS and CLK signals are not required.

As mentioned above, there are four sense amplifiers corresponding to memory cell arrays. However, as known by one of ordinary skill in the art taking the present specification as a whole, the number of sense amplifiers and memory cell arrays, and thus the number of the above-mentioned structures, can be changed readily depending on the design specifications and requirements of the memory system.

Moreover, in the first and second embodiments, the sense circuit 7-1 includes fast sense amplifiers. However, at least one sense circuit including slow sense amplifiers could be provided and would be sufficient. Further, the P-type MOS transistor Qp2 in the sense amplifier SA could be changed to an N-type MOS transistor, and such a design change would be well within the grasp of one of ordinary skill in the art taking the present specification as a whole. Further, the logic (e.g., levels) of the signals are exemplary, and may be suitably changed (e.g., reversed) depending on the designer's requirements and constraints.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system comprising:
   a first memory cell array and a second memory cell array, each including a plurality of word lines connected to a plurality of memory cells of said first and second memory cell arrays, respectively;
   a first activator for activating a first word line of said word lines of said first memory cell array, and for making said first memory cell array output data from said memory cells connected to said first word line;
   a second activator for activating a second word line of said word lines of said second memory cell array, and for making said second memory cell array output data from said memory cells connected to said second word line;
   a first sense circuit for receiving said data from said first memory cell array, and for amplifying said data from said first memory cell array;
   a second sense circuit for receiving said data from said second memory cell array, and for amplifying said data from said second memory cell array at a rate faster than that of said first sense circuit; and
   an output control circuit for outputting said data of said second sense circuit, and for outputting subsequently said data of said first sense circuit.

2. The memory system as recited in claim 1, wherein said first sense circuit comprises a plurality of first sense amplifiers corresponding to said memory cells of said first memory cell array, and said second sense circuit comprises a plurality of second sense amplifiers corresponding to said memory cells of said second memory cell array.

3. The memory system as recited in claim 2, further comprising:
   a judging circuit for judging whether a page access mode is required based on an input signal having a predetermined timing associated with at least one of said first and second memory cell arrays, and for outputting a judging signal when the page access mode is required; and
   a signal generator for receiving the judging signal, and for outputting a sense activating signal for said first sense circuit and said second sense circuit when said signal generator receives the judging signal.

4. The memory system as recited in claim 3, wherein said first sense amplifier comprises:
   a first metal oxide semiconductor (MOS) transistor having a gate for receiving the judging signal and a source-drain path between a first node and a first reference voltage;

a second MOS transistor having a gate for receiving the judging signal and a source connected to a second reference voltage;

a third MOS transistor having a gate connected to said first node and a source-drain path between said first node and a drain of said second MOS transistor;

a fourth MOS transistor having a gate connected to a second node and a source-drain path between said first node and said first reference voltage;

a fifth MOS transistor having a gate connected to said first node and a source-drain path between said second node and a third node; and a sixth MOS transistor having a gate connected to said third node and a source-drain path between said third node and said second reference voltage, wherein a voltage of said third node is associated with one of said data of said first sense circuit.

5. The memory system as recited in claim 4, wherein said second sense amplifier comprises:

a seventh MOS transistor having a gate for receiving the judging signal and a source-drain path between a fourth node and said first reference voltage;

an eighth MOS transistor having a gate for receiving the judging signal and a source connected to said second reference voltage;

a ninth MOS transistor having a gate connected to said first reference voltage and a source-drain path between said fourth node and a drain of said eighth MOS transistor;

a tenth MOS transistor having a gate connected to a fifth node and a source-drain path between said fourth node and said first reference voltage;

an eleventh MOS transistor having a gate connected to said fourth node and a source-drain path between said fifth node and a sixth node; and a twelfth MOS transistor having a gate connected to said sixth node and a source-drain path between said sixth node and said second reference voltage, wherein a voltage of said sixth node is associated with one of said data of said second sense circuit.

6. The memory system as recited in claim 5, wherein said second, third, sixth, eighth, ninth and twelfth MOS transistors each comprise a P-type transistor, and said first, fourth, fifth, seventh, tenth and eleventh MOS transistors each comprise an N-type transistor.

7. The memory system as recited in claim 6, wherein the memory system is formed on a single semiconductor chip.

8. The memory system as recited in claim 1, wherein the memory system is formed on a single semiconductor chip.

9. The memory system as recited in claim 7, wherein the memory system is operated by an off-chip central processing unit (CPU).

10. The memory system as recited in claim 8, wherein the memory system is operated by an off-chip central processing unit (CPU).

11. The memory system as recited in claim 7, further comprising an on-chip central processing unit (CPU) formed on said single semiconductor chip.

12. The memory system as recited in claim 8, further comprising an on-chip central processing unit (CPU) formed on said single semiconductor chip.

13. The memory system as recited in claim 9, wherein said memory cells of said first memory cell array and of said second memory cell array comprise read-only memory (ROM) cells.

14. The memory system as recited in claim 11, wherein said memory cells of said first memory cell array and of said second memory cell array comprise read-only memory (ROM) cells.

15. A sense amplifier comprising:

a first metal oxide semiconductor (MOS) transistor having a gate receiving an input signal and a source connected to a first reference voltage;

a second MOS transistor having a gate connected to a first node and a source-drain path between said first node and a drain of the first MOS transistor;

a third MOS transistor having a gate connected to a second node and a source-drain path between said first node and a second reference voltage;

a fourth MOS transistor having a gate receiving the input signal and a source-drain path between the second node and the second reference voltage;

a fifth MOS transistor having a gate connected to said first node and a source-drain path between said second node and a third node;

a sixth MOS transistor having a gate connected to said third node and a source-drain path between said third node and said first reference voltage; and a seventh MOS transistor having a gate for receiving a judging signal and a source-drain path between said first node and said second node and said second reference voltage.

16. The sense amplifier as recited in claim 15, further comprising an eighth MOS transistor having a gate for receiving a judging signal and a source-drain path between said first reference voltage and an opposite side of said first node of said source-drain path in said second MOS transistor.

17. The sense amplifier of claim 16, wherein said second, sixth and eight MOS transistors each comprise a P-type transistor, and said third, fifth and seventh MOS transistors each comprise an N-type transistor.

18. The memory system as recited in claim 17, wherein said first reference voltage is higher than said second reference voltage.

19. A sense amplifier comprising:

a first metal oxide semiconductor (MOS) transistor having a gate receiving an input signal and a source connected to a first reference voltage;

a second MOS transistor having a gate connected to a first node and a source-drain path between said first node and a first reference voltage;

a third MOS transistor having a gate connected to a second node and a source-drain path between said first node and a second reference voltage;

a fourth MOS transistor having a gate connected to a second node and a source-drain path between said first node and a second reference voltage;

a fifth MOS transistor having a gate connected to said first node and a source-drain path between said second node and a third node; and a sixth MOS transistor having a gate connected to said third node and a source-drain path between said third node and said first reference voltage, wherein said second and sixth MOS transistors each comprise a P-type transistor, and said third and fifth MOS transistors each comprise an N-type transistor.

20. The memory system as recited in claim 19, wherein said first reference voltage is higher than said second reference voltage.

* * * * *